United States Patent [19]

Hamada et al.

[11] Patent Number: 5,378,514
[45] Date of Patent: Jan. 3, 1995

[54] FRAME-SUPPORTED PELLICLE FOR PHOTOLITHOGRAPHY

[75] Inventors: Yuichi Hamada; Yoshihiko Nagata; Meguru Kashida; Yoshihiro Kubota, all of Gunma, Japan

[73] Assignee: Shin-Etsu Chemical Co., Ltd., Tokyo, Japan

[21] Appl. No.: 103,925

[22] Filed: Aug. 6, 1993

[30] Foreign Application Priority Data

Aug. 21, 1992 [JP] Japan .................................. 4-245827

[51] Int. Cl.⁶ .............................................. B32B 3/00
[52] U.S. Cl. ..................................... 428/14; 428/421; 428/422; 156/322; 156/344
[58] Field of Search ..................... 428/14, 422, 421; 156/322, 344

[56] References Cited

U.S. PATENT DOCUMENTS 5,061,024 10/1991 Keys ..................................... 359/350

Primary Examiner—Alexander S. Thomas
Attorney, Agent, or Firm—McAulay Fisher Nissen Goldberg & Kiel

[57] ABSTRACT

Proposed is a novel frame-supported pellicle for dust-proof protection of a photomask used in the photolithographic patterning work in the manufacture of semiconductor devices and the like. The frame-supported pellicle of the invention consists of a pellicle membrane made from a specific fluorocarbon-containing polymer which is adhesively bonded in a slack-free fashion to a surface of a rigid pellicle frame by means of a hot-melt adhesive which is a fluorocarbon-containing polymer of the same type as or similar to the fluorocarbon-containing polymer of the membrane so that no problems are involved in the adhesive bonding relative to the compatibility between the adhesive and the membrane which otherwise is poorly susceptible to adhesive bonding.

4 Claims, No Drawings

FRAME-SUPPORTED PELLICLE FOR PHOTOLITHOGRAPHY

BACKGROUND OF THE INVENTION

The present invention relates to a frame-supported pellicle for photolithography or, more particularly, to a pellicle consisting of a rigid frame and a pellicle membrane supported by the frame in a slack-free fashion as being adhesively bonded thereto and used for dust-proof protection of a photomask used in the photolithographic patterning work of various kinds of electronic devices such as LSIs, VLSIs, liquid-crystal display units and the like as well as to a method for the preparation thereof.

As is well known, the so-called photolithographic patterning work is widely undertaken in the manufacture of various kinds of electronic devices such as LSIs, VLSIs, liquid-crystal display units and the like, in which the photoresist layer on the substrate such as semiconductor silicon wafers and base plates of liquid-crystal display units is exposed pattern-wise to actinic rays such as ultraviolet light through a so-called photomask which is a transparency bearing the fine pattern to be formed in the photoresist layer. The pattern on the photomask is so fine that any dust particles deposited on the photomask greatly affect the quality of pattern reproduction resulting in a decrease in the yield of acceptable products.

It is a usual practice accordingly that the photolithographic patterning work is conducted in a clean room freed from dust particles floating in the air as completely as possible but perfect cleanness of photomasks can hardly be obtained even in a clean room of the highest degree of cleanness. Therefore, a conventional means to ensure cleanness of a photomask is to protect the photomask by mounting a frame-supported pellicle thereon, which consists of a rigid frame to be mounted on and fixed to the photomask by means of a pressure-sensitive adhesive and a highly transparent pellicle membrane of a plastic resin adhesively bonded to the frame in a slack-free fashion so that dust particles are never deposited on the surface of the photomask but are deposited on the pellicle membrane. The dust particles deposited on the pellicle membrane have little adverse influences on the quality of pattern reproduction since the light for exposure is focused on the photomask and not on the pellicle membrane at a distance from the photomask.

Needless to say, a primary requirement for the pellicle membranes is that transmission of light for the pattern-wise exposure therethrough is as high as possible. In this regard, several polymeric materials such as nitrocellulose, cellulose acetate and the like are widely used as a material of pellicle membranes. In connection with the method for adhesive bonding of a pellicle membrane to a frame, Japanese Patent Kokai No. 58-219023 proposes that a pellicle membrane made from these polymeric materials is attached and bonded to the surface of a pellicle frame, which is made from aluminum, stainless steel, polyethylene and the like, wet with an organic solvent capable of dissolving the polymer of the membrane. Alternatively, the pellicle membrane can be adhesively bonded to the surface of a pellicle frame by using an acrylic or epoxy resin-based adhesive (see, for example, U.S. Pat. No. 4,861,402 and Japanese Patent Publication No. 63-27707). Besides the above mentioned cellulose derivatives as a material of the pellicle membrane, a proposal has been recently made for the use of an amorphous fluorocarbon polymer. The lower surface of the pellicle frame, i.e. the surface opposite to the surface to which the pellicle membrane is adhesively bonded, is usually coated with a pressure-sensitive adhesive based on a polybutene resin, polyvinyl acetate resin, acrylic resin and the like in order to facilitate mounting of the pellicle on a photomask. Commercial products of frame-supported pellicles are usually provided with a release paper sheet to temporarily protect the adhesive layer on the lower surface of the frame from inadvertent sticking and to ensure easy handling thereof.

The adhesive, by which the pellicle frame and the pellicle membrane are adhesively bonded together, also must satisfy various requirements. In addition to a high adhesive bonding strength obtained therewith to ensure stability of the supported state of the membrane on the frame, the adhesive is required to be highly resistant against irradiation with ultraviolet light because the adhesive layer between the pellicle membrane and the frame is directly exposed to the ultraviolet light during the photolithographic patterning process since otherwise the adhesive causes degradation after a relatively short time of service under ultraviolet light to become brittle so that the thus embrittled adhesive per se produces dust particles if not to mention the decrease in the adhesive bonding strength eventually leading to separation of the membrane from the frame. Conventional acrylic and epoxy resin-based adhesives are not quite satisfactory in this regard. When the pellicle membrane is formed from an amorphous fluorocarbon polymer, no satisfactory adhesive bonding strength can be obtained between the frame and the membrane because fluorocarbon polymers are generally little susceptible to adhesive bonding with a conventional adhesive based on an acrylic or epoxy resin.

SUMMARY OF THE INVENTION

The present invention accordingly has an object to provide a novel and improved frame-supported pellicle for dust-proof protection of a photomask in the photolithographic patterning work free from the above described problems and disadvantages in the conventional frame-supported pellicles.

Another object of the present invention is to provide a method for the preparation of the above mentioned novel and improved frame-supported pellicle.

Thus, the frame-supported pellicle for dust-proof protection of a photomask provided by the present invention is an integral body consisting of:

(a) a rigid pellicle frame;
(b) a layer of a hot-melt adhesive; and
(c) a pellicle membrane made from a first amorphous fluorocarbon-containing polymer having a cyclic structure in the molecule, the adhesive layer intervening between a surface of the pellicle frame and the pellicle membrane so as to support the pellicle membrane by adhesively bonding the same to the pellicle frame and the adhesive being made from a second amorphous fluorocarbon-containing polymer of a hot-melt type having a cyclic structure in the molecule.

In particular, each of the first and second amorphous fluorocarbon-containing polymers having a cyclic structure is a copolymer consisting of a tetrafluoroethylene moiety and a cyclic perfluoro ether moiety.

The inventive method for the preparation of the above defined frame-supported pellicle comprises the steps off (A) forming a film of a first amorphous fluorocarbon-containing polymer having a cyclic structure by the casting method of a solution of the polymer on the surface of a substrate followed by drying;

(B) forming a layer of a hot-melt adhesive of a second amorphous fluorocarbon-containing polymer having a cyclic structure on one surface of a rigid pellicle frame;

(C) heating the layer of the hot-melt adhesive on the surface of the pellicle frame at a temperature higher than the glass transition point of the hot-melt adhesive;

(D) mounting the film of the first amorphous fluorocarbon-containing polymer formed on the substrate surface on the surface of the pellicle frame coated with the heated hot-melt adhesive followed by cooling to effect adhesive bonding by the hot-melt adhesive; and (E) removing the substrate from the film of the first amorphous fluorocarbon-containing polymer.

DETAILED DESCRIPTION OF THE PREFERRED EMBODIMENTS

As is described above, the inventive frame-supported pellicle is an integral body consisting of a rigid frame and a pellicle membrane adhesively bonded to the frame in a slack-free fashion by means of a layer of a hot-melt adhesive intervening therebetween. Characteristically, each of the pellicle membrane and the hot-melt adhesive is made from an amorphous fluorocarbon-containing polymer having a cyclic structure in the molecule which may be the same one or different but similar ones so that the adhesive bonding strength therebetween can be high enough without the problem of incompatibility and, since these fluorocarbon-containing polymers are highly resistant against ultraviolet light, a high-performance frame-supported pellicle with a long serviceable life can be obtained.

The amorphous fluorocarbon-containing polymer having a cyclic structure in the molecule for the pellicle membrane is preferably an amorphous copolymer consisting of a tetrafluoroethylene moiety and a cyclic perfluoro ether moiety. Examples of commercially available products of such an amorphous fluorocarbon-containing polymer include Teflon AF (trade name by Du Pont Co.) which is a copolymer consisting of the moieties of the formula

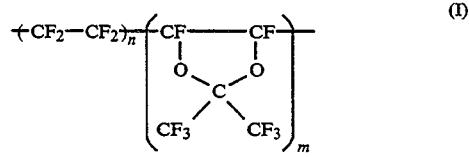

and Sytops (trade name by Asahi Glass Co.) which are each a copolymer consisting of the moieties of the formula

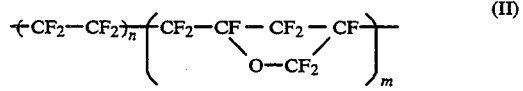

in which the subscripts n and m are each a positive integer (see Japanese Patent Kokai No. 4-104155).

The membrane of the above mentioned fluorocarbon-containing copolymeric resin can be prepared by the method of casting of a solution of the resin on a substrate having a flat and smooth surface such as a well polished fused quartz glass plate. Suitable organic solvents include fluorocarbon-containing compounds such as perfluoro( 2-butyl tetrahydrofuran) and perfluoro(2-propyl tetrahydropyran). The casting solution can be prepared by dissolving the copolymeric resin in these solvents in a concentration of 3 to 10% by weight and the solution is uniformly spread over the surface of the substrate by using a known coating machine such as a spin coater, knife coater and the like. The film to serve as the pellicle membrane should have a thickness in the range from 0.5 to 10 $\mu$m or, preferably, from 0.8 to 5 $\mu$m in view of the balance between mechanical strength and transmissivity to ultraviolet light. It is desirable that the pellicle membrane has at least 95% of the transmission of ultraviolet light.

The thus prepared pellicle membrane is very stable and free from yellowing retaining high transparency and occurrence of rupture over a long period of service. Needless to say, the pellicle membrane has excellent transmission to the light of the wavelength in the range from 210 to 500 nm including the g-line of 436 nm wavelength, i-line of 365 nm wavelength and excimer laser beam or KrF laser beam of 248 nm wavelength frequently used in the photolithographic patterning works.

In the frame-supported pellicle of the invention, as is mentioned before, the adhesive, with which the pellicle membrane and the pellicle frame are adhesively bonded together, is also a polymeric material which is a fluorocarbon-containing hot-melt adhesive compound. The same fluorocarbon-containing polymers as used in the preparation of the pellicle membrane, such as Teflon AF and Sytops, as such can be used as the adhesive so that no problems are involved in the adhesive bonding in connection with the compatibility between the pellicle membrane and the adhesive by which the membrane is adhesively bonded to the pellicle frame.

In conducting adhesive bonding of the pellicle membrane and the pellicle frame by using the above mentioned hot-melt adhesive, the pellicle frame is coated on one surface with a solution of the hot-melt adhesive and, after drying the adhesive layer by evaporating the solvent, the dried adhesive layer is heated at a temperature higher than the glass transition point of the hot-melt adhesive followed by mounting of the pellicle membrane formed by the solution casting method on a substrate plate such as a fused quartz glass plate and, after cooling of the heated adhesive, removal of the substrate plate from the pellicle membrane so that the pellicle membrane is supported by the pellicle frame in a slack-free fashion.

Since the adhesive to bond the pellicle frame and the pellicle frame is a polymer of the same type as or similar to that of the membrane, excellent adhesive bonding can be obtained therebetween without the problem of poor compatibility of the adhesive with the membrane. Moreover, the adhesive is highly resistant against ultraviolet irradiation so that the flame-supported pellicle of the invention has good serviceable life.

In the following, an example is given to illustrate the frame-supported pellicle and the method for the preparation thereof according to the invention in more detail.

EXAMPLE

A fluorocarbon-containing polymer (Sytop CTXS, a product by Asahi Glass Co.), consisting of the tetrafluoroethylene moiety and the perfluorinated cyclic ether moiety as shown by the above given general formula (II), in which the molar ratio of the tetrafluoroethylene moiety to the perfluorinated cyclic ether moiety is 0.52:1, was dissolved in a fluorocarbon-containing solvent (CT Solve 180, a product by the same company, *supra*) in a concentration of 6.0% by weight. This solution was uniformly applied to the surface of the well polished surface of a fused quartz glass disc of 200 mm diameter and 3 mm thickness by using a spin coater followed by drying at 180° C. for 15 minutes to give a dried film of the polymer having a thickness of 0.84 µm.

Separately, a surface-anodized square aluminum frame having dimensions of 120 mm a side (outer), 116 mm a side (inner) and thickness of 6 mm was coated on one surface with a 9.0% by weight solution of Sytop CTXA (*supra*) in CT Solve 180 (*supra*) followed by air-drying for 3 hours to form a layer of the dried polymer to serve as a hot-melt adhesive.

The frame having a coating layer of the polymer on one surface was mounted on a hot plate kept at 130° C. with the coating layer of the polymer facing upwardly and kept there for 5 minutes to heat the polymer at a temperature higher than the glass transition point thereof. Thereafter, the polymeric film formed on the fused quartz glass disc as the substrate was mounted thereon together with the substrate followed by cooling to room temperature so as to adhesively bond the film as the pellicle membrane to the aluminum frame. After cooling, the fused quartz glass disc as the substrate was removed from the polymeric film which was trimmed along the outer periphery of the aluminum frame so as to give a frame-supported pellicle. The pellicle was slack-free and free from the troubles of separation from the frame or occurrence of rupture and could withstand a long time of service in the photolithographic patterning works.

What is claimed is:

1. A frame-supported pellicle for dust-proof protection of a photomask which is an integral body consisting of:
   (a) a rigid pellicle frame;
   (b) a layer of a hot-melt adhesive; and
   (c) a pellicle membrane made from a first amorphous fluorocarbon-containing polymer having a cyclic structure in the molecule, the adhesive layer intervening between a surface of the pellicle frame and the pellicle membrane so as to support the pellicle membrane by adhesively bonding the membrane to the pellicle frame and the adhesive being made from a second amorphous fluorocarbon-containing polymer of a hot-melt type having a cyclic structure in the molecule.

2. The frame-supported pellicle for dust-proof protection of a photomask as claimed in claim 1 in which each of the first and second amorphous fluorocarbon-containing polymers having a cyclic structure in the molecule is a copolymer consisting of a tetrafluoroethylene moiety and a cyclic perfluoro ether moiety.

3. The frame-supported pellicle for dust-proof protection of a photomask as claimed in claim 2 in which the first and the second amorphous fluorocarbon-containing polymers having a cyclic structure in the molecule are one and the same copolymer consisting of a tetrafluoroethylene moiety and a cyclic perfluoro ether moiety.

4. A method for the preparation of a frame-supported pellicle which comprises the steps of:
   (A) forming a film of a first amorphous fluorocarbon-containing polymer having a cyclic structure in the molecule by the casting method of a solution of the polymer on the surface of a substrate followed by drying;
   (B) forming a layer of a hot-melt adhesive of a second amorphous fluorocarbon-containing polymer having a cyclic structure in the molecule on one surface of a rigid pellicle frame;
   (C) heating the layer of the hot-melt adhesive on the surface of the pellicle frame at a temperature higher than the glass transition point of the hot-melt adhesive;
   (D) mounting the film of the first amorphous fluorocarbon-containing polymer formed on the substrate on to the surface of the pellicle frame coated with the heated hot-melt adhesive followed by cooling of the hot-melt adhesive; and
   (E) removing the substrate from the film of the first amorphous fluorocarbon-containing polymer.

* * * * *